US009590535B2

(12) United States Patent
Bargatin et al.

(10) Patent No.: US 9,590,535 B2
(45) Date of Patent: Mar. 7, 2017

(54) MEMS-BASED INTEGRATED INVERTER FOR WAFER-SCALE THERMIONIC ENERGY CONVERTER

(71) Applicant: The Board of Trustees of the Leland Stanford Junior University, Palo Alto, CA (US)

(72) Inventors: Igor Bargatin, Mountain View, CA (US); Roger T. Howe, Los Gatos, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 751 days.

(21) Appl. No.: 13/944,570

(22) Filed: Jul. 17, 2013

(65) Prior Publication Data
US 2014/0049135 A1  Feb. 20, 2014

Related U.S. Application Data

(60) Provisional application No. 61/684,309, filed on Aug. 17, 2012.

(51) Int. Cl.
*H02N 3/00* (2006.01)
*B81B 3/00* (2006.01)

(52) U.S. Cl.
CPC ............. *H02N 3/00* (2013.01); *B81B 3/0032* (2013.01)

(58) Field of Classification Search
CPC ................................ H02N 3/00; B81B 3/0032
USPC ........................................................ 310/306
See application file for complete search history.

(56) References Cited

U.S. PATENT DOCUMENTS

| 4,436,651 A * | 3/1984 | Corneille | H01J 1/14 252/512 |
|---|---|---|---|
| 5,969,848 A * | 10/1999 | Lee | G02B 26/06 310/328 |
| 2002/0109894 A1* | 8/2002 | Clark | G02B 26/06 359/224.1 |
| 2004/0164799 A1* | 8/2004 | Cox | H03F 13/00 330/174 |
| 2005/0104512 A1* | 5/2005 | Tavkhelidze | H01J 45/00 313/506 |
| 2010/0019619 A1* | 1/2010 | Hagg | H01J 45/00 310/306 |
| 2014/0333213 A1* | 11/2014 | Cheatham, III | H01J 29/481 315/167 |

FOREIGN PATENT DOCUMENTS

WO    WO03090245    * 10/2003

\* cited by examiner

*Primary Examiner* — Quyen Leung
*Assistant Examiner* — Eric Johnson
(74) *Attorney, Agent, or Firm* — Lumen Patent Firm

(57) ABSTRACT

A thermionic energy converter is provided that includes an anode, a cathode, where the anode is disposed opposite the cathode, and a suspension, where a first end of the suspension is connected to the cathode and a second end of the suspension is connected to the anode, where the suspension moveably supports the cathode above the anode to form a variable gap between the anode and the cathode, where the variable gap is capable of enabling a variable thermionic current between the anode and the cathode, where the thermionic converter is capable of an AC power output.

6 Claims, 2 Drawing Sheets

MEMS-BASED INTEGRATED INVERTER FOR WAFER-SCALE THERMIONIC ENERGY CONVERTER

CROSS-REFERENCE TO RELATED APPLICATIONS

This application claims priority from U.S. Provisional Patent Application 61/684,309 filed Aug. 17, 2012, which is incorporated herein by reference.

STATEMENT OF GOVERNMENT SPONSORED SUPPORT

This invention was made with Government support under contract N66001-10-1-4004 awarded by Defense Advanced Research Projects Agency (DARPA). The Government has certain rights in this invention.

FIELD OF THE INVENTION

The present invention relates generally to thermionic microelectromechanical systems (MEMS) energy converters. More particularly, the invention relates to an inverter in a thermionic MEMS energy converter for generating AC electric power.

BACKGROUND OF THE INVENTION

Thermionic energy converters (TECs) are heat engines that convert heat directly to electricity. The simplest devices have a simple parallel-plate device structure with no moving parts. This energy conversion process is based on the evaporation of electrons from conductors at high temperatures, known as the thermionic emission effect. The first practical TECs with conversion efficiencies of 10-15% have been demonstrated. Other TECs for converting heat from a nuclear-fission heat sources into electric power were developed for deep-space missions, where the space-related efforts culminated in the successful flight of a 6-kW thermionic converter. This device was based on vacuum-tube technology and had electrode gaps on the order of 100 µm, created using traditional precision machining tools.

As the emitter is heated to high temperatures, the thermal distribution develops a long high-energy tail so that some electrons begin to overcome the work function barrier and evaporate from the hot emitter. The electrons can then cross the vacuum inter-electrode gap, condense at the relatively cold collector, and finally return to the emitter through an external load using the difference between the Fermi levels of the two electrodes to perform useful work. The thermionic currents emitted from the emitter, and sometimes also from the collector, are governed by the classic Richardson-Dushmann law.

Space charge between the electrodes can dramatically reduce the output power and efficiency of TECs because the electrons traversing the inter-electrode gap repel each other. For macroscopic gaps (>100 µm), the resulting additional energy barrier can reduce the output power and the conversion efficiency by many orders of magnitude. As a result, previous TECs ignited a cesium plasma to neutralize the space charge between the electrodes. Such plasma TECs achieved high output powers, but only at the cost of greatly increased complexity and decreased maximum efficiency. As an alternative to using plasma, the deleterious effects of space charge can also be mitigated by making the gap small enough that there is not enough space to develop a significant additional barrier. It has long been known that such vacuum TECs can be more efficient than plasma TECs if micron-scale gaps are used.

Thermionic energy converters normally generate DC electricity, meaning that their output voltage and current are constant in time. The gap between the cathode and anode in these devices also remains approximately constant in time. The output current and voltage are typically chosen to maximize the product of the current and voltage, i.e., the output power. As with photovoltaic cells, integrating these TECs into the standard electric grid requires an external inverter to transform the DC output into 60-Hz AC electricity.

What is needed is a TEC having a dynamic gap to produce an AC power output directly that enables integration of thermionic converters into the power grid.

SUMMARY OF THE INVENTION

To address the needs in the art, a thermionic energy converter is provided that includes an anode, a cathode, where the anode is disposed opposite the cathode, and a suspension, where a first end of the suspension is connected to the cathode and a second end of the suspension is connected to the anode, where the suspension moveably supports the cathode above the anode to form a variable gap between the anode and the cathode, where the variable gap is capable of enabling a variable thermionic current between the anode and the cathode, where the thermionic converter is capable of an AC power output.

According to one aspect of the invention, the cathode includes a plate made from a refractory metal.

In a further aspect of the invention, the cathode includes an electrostatic vertical comb drive, where the electrostatic vertical comb drive is capable of applying a vertical force to change the variable gap, where a current-voltage correlation of the thermionic converter is modulated with time. In one aspect, the suspension includes displacement bimorphs disposed to form the initial gap between the cathode and the anode. In another aspect, a position sensor is integrated to the cathode to enable a closed-loop control of the cathode position, where control of the variable gap as a function of time is capable of outputting a current-voltage relationship that drives a resistive load for an optimal power transfer. In a further aspect, control of the variable is capable of outputting a sinusoidal current waveform. In another aspect, the sinusoidal current waveform has a DC offset.

DETAILED DESCRIPTION

Thermionic energy converters are a promising approach to converting heat into electricity. These devices can be fabricated using MEMS-based processes in which a suspended microcathode is the only component that is heated to high temperatures. These devices produce a DC current when operated in the conventional manner and therefore require an inverter to provide standard 110-V 60-Hz AC electric power. A model of the dependence of thermionic current on the gap between the microcathode and the underlying anode is provided. This variation in current provides the physical basis for this invention, which allows the thermionic converter to produce an AC power output directly that enables integration of thermionic converters into the power grid.

One embodiment, the current invention integrates an actuator into the suspension of the microcathode, so that its position can be modulated at the desired AC frequency (e.g., 60 Hz), which will therefore modulate the current-voltage characteristic from the thermionic converter with time. Closed-loop control of the position of the micro-cathode can be implemented with an integrated capacitive MEMS position sensor, based on a high-frequency electric readout. With the proper choice for the gap as a function of time, the resulting current-voltage characteristic drives a purely resistive load, ensuring optimal power transfer. In one embodiment, the current waveform (current vs. time function) could preferably be sinusoidal (with a DC offset). By outputting power in this form, minimal additional electrical components are needed to remove the DC offset and achieve synchronous AC with the power grid.

Turning now to a more detailed example, previously demonstrated TECs could only produce DC electricity, necessitating an inverter for grid integration. The invention provides microfabricated TECs to produce standard 60-Hz AC electricity directly, where the I-V characteristic of a TEC strongly depend on the distance between the cathode and anode. By modulating the cathode-anode distance at 60 Hz using a built-in MEMS actuator, the current invention modulates the power output of a TEC to match the AC frequency of the US power grid. According to another aspect of the invention, a built-in MEMS inverter can be produced at a small incremental cost using the same microfabrication techniques as the TEC cathode and anode.

Figure 1:
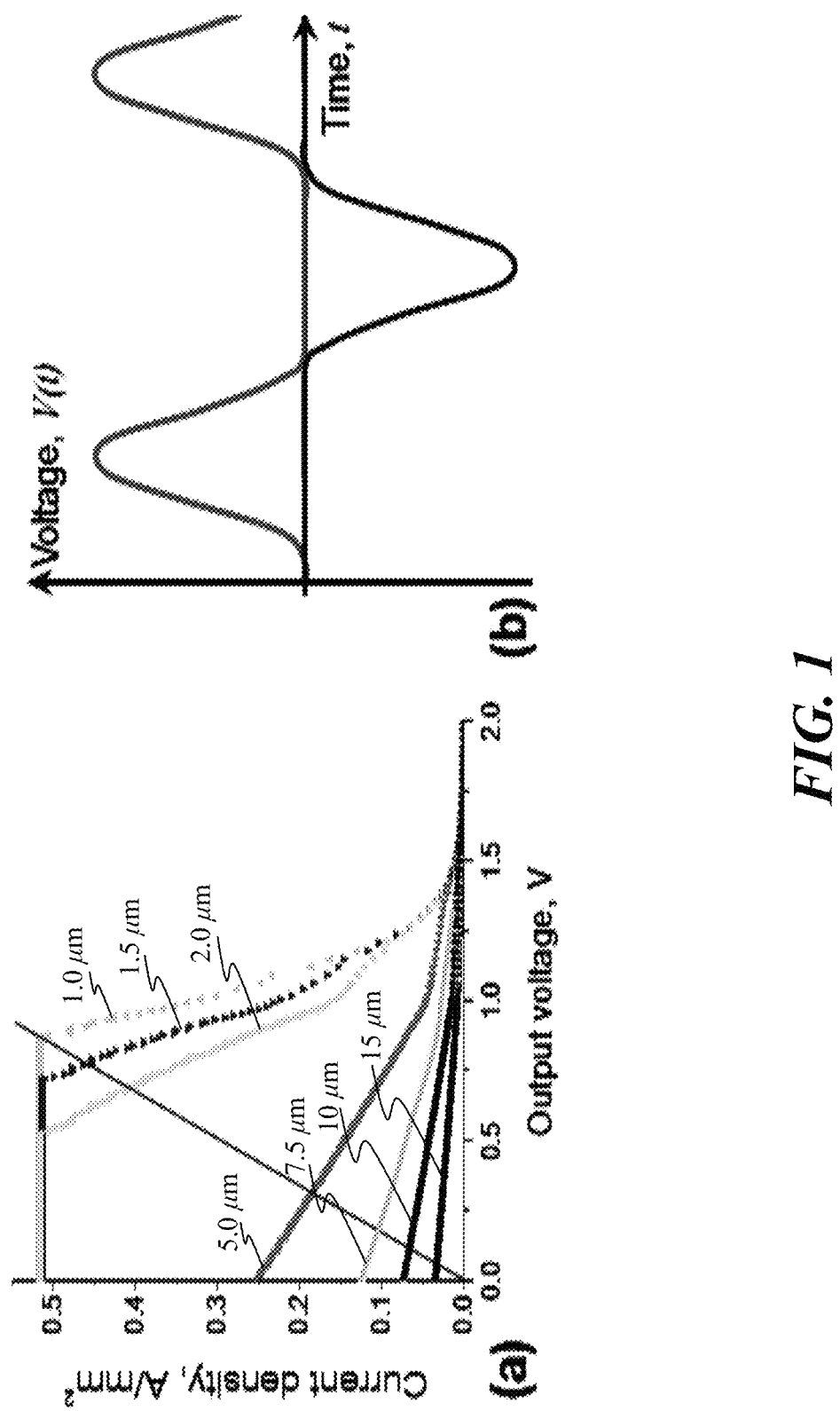
FIG. 1a shows a graph of the I-V characteristic of a TEC that depends strongly on the gap due to the space charge effect, according to one aspect of the invention.
FIG. 1b shows a graph of one TEC array element that can drive an external resistive load with a voltage varying between ~0.7 V and ~0.2 V with a waveform similar to half a sinusoid, according to one aspect of the invention.

According to one embodiment of the invention, microfabricated TECs have additional degrees of freedom that enable the elimination of the need for an external inverter. In particular, the gap between the suspended cathode and the substrate anode does not have to stay constant, but instead can be controlled using MEMS actuation techniques. Since the I-V characteristic of a TEC depends strongly on the gap due to the space charge effect (see FIG. 1a), if the gap is varied periodically at 60 Hz between, for example, 2 and 10 μm, one TEC array element can drive an external resistive load with a voltage varying between ~0.7 V and ~0.2 V with a waveform similar to half a sinusoid (FIG. 1b). FIG. 1a shows I-V characteristic of a microfabricated TEC for various gaps between the cathode and anode. The reduction in the current at large gaps is due to the buildup of electron charge in the gap, which repels other electrons and prevents them from leaving the cathode. The straight line shows the I-V characteristic of a resistive load. Since the intersection of the I-V characteristic of the load and the converter determines the operating point, the output voltage and power into the load depends on the inter-electrode gap. In FIG. 1b, since a micro-TEC element can generally produce only unipolar current (corresponding to electrons traveling from cathode to anode), with a periodically varying gap, it can produce only one half of a sinusoidal waveform (top curve). Another micro-TEC element that is wired with opposite polarity can produce the other half of the sinusoidal waveform (bottom curve). In practice, half of the micro-TEC array elements are used to produce the top curve and the other half, the bottom curve. A purer sinusoidal voltage waveform is then generated by non-linear modulation of the gap.

Figure 2:
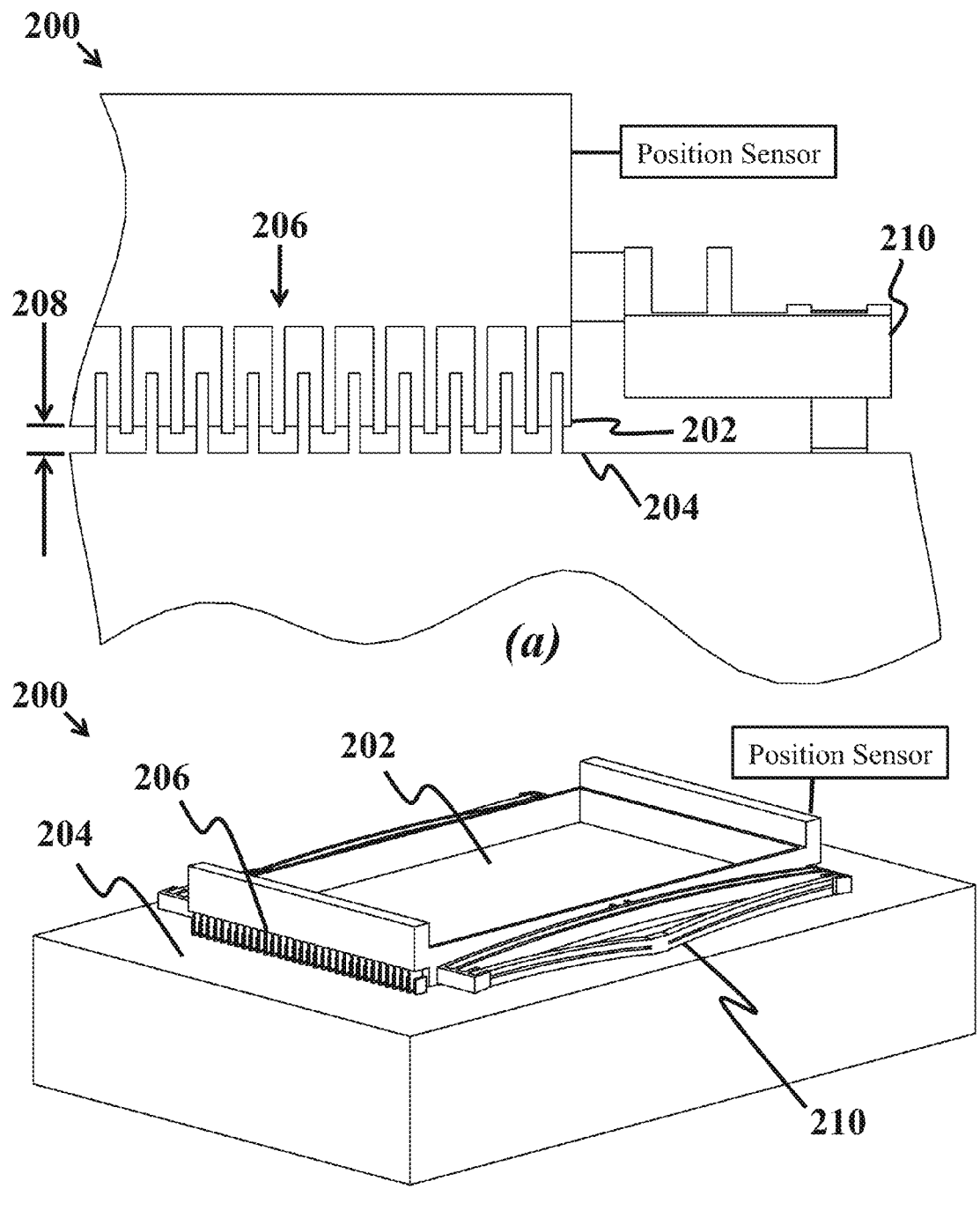
FIGS. 2a-2b show an integrated inverter TEC with the cathode plate suspended over a substrate anode using displacement bimorphs and an electrostatic vertical comb drive, according to one embodiment of the invention.

An example TEC array element with adjustable gap is shown in FIGS. 2a-2b, according to one embodiment of the invention. In one embodiment, FIGS. 2a-2b show an integrate inverter TEC 200, where the cathode 202 is a plate made from a refractory metal suspended over a substrate anode 204. The front and back of the suspended plate 202 incorporate an electrostatic vertical comb drive 206 that can apply a vertical force to the suspended plate 204 to control the inter-electrode gap 208.

Since the comb drive 206 can pull the suspended plate 202 in only one direction (down), the suspension legs 210 also include displacement bimorphs to form the initial gap 208 of ~10-15 μm between the cathode and anode, according to one embodiment. Such large displacements 208 are commonly achieved in MEMS bimorphs 210 by controlling fabrication stress in a two-layer laminate, so that it bends after release and moves the suspended plate 202 by the required amount. At such large gaps 208, the thermionic current is strongly inhibited by the electron space charge and the output current and voltage are close to zero. However, when the vertical comb drive 208 pulls the cathode 202 down to ~2 μm, the space charge becomes insignificant and the TEC 200 produces the peak current and voltage.

According to one embodiment, it is estimated that the force necessary for such displacement can be created by supplying a combination of −40 V DC signal and ~5 V AC (60 Hz) signal to the vertical comb drive 208. The AC reference signal can be supplied by the electric grid, ensuring synchronization of the output to the electric grid. This combined waveform can be applied only to the bottom half of the comb drive 206, with the top half staying at the same potential as the rest of the suspended cathode 202. While these drive voltages will penetrate to some extent into the gap 208 between the cathode 202 and anode 204, this disturbance can be minimized with proper geometric design. Due to the large negative bias of the bottom teeth of the comb drive 206, they will also repel incoming electrons and therefore, not interfere with the operation of the anode 204 on the substrate. The lack of current to and from the bottom teeth also means that the electrostatic comb drive 206 uses very little power for actuation, consuming only a tiny fraction of the total power produced by the TEC array.

Since the suspended cathodes 202 in this structure would only be "active"—i.e., emitting large thermionic current—about half the time, the efficiency of the TEC 200 would likely be less that in a DC-output TEC. However, since in an optimized TEC 200 most of the heat lost by the cathode 202 is carried by the thermionically emitted electrons, the parasitic heat loss would be almost proportionally smaller than in a DC-output TEC. According to simulations by the inventors, an optimized TEC 200 operating with an inverter structure in the 60-Hz AC will be only a few percent less efficient than a DC-output TEC. However, this small decrease in the efficiency is still economical because it eliminates the need for a costly external inverter.

The use of comb drives 206 to modulate the output of a TEC 200 introduces MEMS technology into the domain of high temperatures and the entirely new application area of energy generation.

Advantages of the current invention include AC electricity generated directly without the use of an external inverter, where a TEC system 200 with an integrated MEMS inverter that consumes only a small fraction of produced energy for actuation is provided.

According to one aspect of the invention, the thermionic current from the cathode 202 is limited by space charge at large interelectrode gaps 208. The modulation of current by at least 10% due to space charge is enabled by periodically varying the gap 208 between the cathode 202 and anode 204 using comb drive 208 or other MEMS actuation technique.

In another embodiment of the invention, by modulating the current output from two TEC elements (202/204) connected with opposite polarities, both half of the sine wave and therefore AC electricity are produced into a resistive load. The DC components of the two TEC outputs cancel each other and therefore do not contribute to the AC power output. The device 200 sustains the required temperatures and high displacement motion over extended time.

A further embodiment of the invention includes the TEC 200 with integrated microinverters operating in arrays rather than just two elements. The efficiency of energy conversion is at least 10% relative to the energy of absorbed of radiant heat.

The MEMS inverter 200 is a totally new concept that includes actuating the microcathode 202 to modulate the thermionic emission current. Its major impact on reducing the overall system cost of micro-CHP, by merging the inverter function into the micro-TEC, is new and provides unexpected results.

In FIGS. 2a-2b, the suspended cathode 202 is rectangular in this to facilitate integration of the displacement actuators 206. The temperature varies from 1000° C. at the suspended cathode 202 to 100° C. at the substrate 204. The displacement bimorphs 210 incorporated into the suspension legs of the cathode 202 on two opposite sides, create an initial out-of-plane displacement 208 of the cathode 202 to the desired height after the fabrication release. The vertical comb drives 206, incorporated into the other two opposite ends of the suspended cathode 202, can periodically drive the suspended cathode 202 at 60 Hz, providing the necessary temporal modulation of the gap 208 between the suspended cathode 202 and the substrate anode 204.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, the suspended emitter plate could be made from materials other than metal, the emitter could be actuated using thermoelastic, piezoelectric or magnetic actuators rather than an electrostatic vertical comb, and the pure AC output could be produced without using two arrays of converters producing only half of the sinusoidal waveform.

All such variations are considered to be within the scope and spirit of the present invention as defined by the following claims and their legal equivalents.

What is claimed:

1. A thermionic energy converter, comprising:
   a. an anode;
   b. a suspended cathode, wherein said anode is disposed opposite said suspended cathode; and
   c. a suspension, wherein said suspension comprises an electrostatic vertical comb drive and a MEMS bimorph, wherein a first end of said suspension is connected to said suspended cathode and a second end of said suspension is connected to said anode, wherein said electrostatic vertical comb drive is disposed to pull said cathode toward said anode, wherein said MEMS bimorph is disposed to repel said cathode from said anode, wherein said suspension moveably supports said suspended cathode above said anode to form a variable gap between said anode and said suspended cathode at a frequency of 60 Hz, wherein non-linear modulation of said gap is enabled by said electrostatic vertical comb drive, wherein said non-linear modulation of said variable gap is capable of enabling a variable thermionic 60 Hz current between said anode and said suspended cathode, wherein said thermionic converter is configured for generating a time-varying unipolar current.

2. The thermionic energy converter of claim 1, wherein said cathode comprises a plate made from a refractory metal.

3. The thermionic energy converter of claim 1, wherein a position sensor is integrated to said cathode to enable a closed-loop control of said cathode position, wherein control of said variable gap as a function of time is capable of outputting a current-voltage relationship that drives a resistive load for an optimal power transfer.

4. The thermionic energy converter of claim 3, wherein said control of said variable is capable of outputting a sinusoidal current waveform.

5. The thermionic energy converter of claim 4, wherein said sinusoidal current waveform has a DC offset.

6. The thermionic energy converter of claim 1 further comprising a second thermionic energy converter that is wired with opposite polarity to said thermionic energy converter, wherein said thermionic energy converter is disposed to produce an upper half of a sinusoidal voltage waveform, wherein said second thermionic energy converter is disposed to produce a bottom half of said sinusoidal voltage waveform, wherein a full sinusoidal voltage waveform is generated by non-linear modulation of each said variable gap, wherein said thermionic energy converter and said second thermionic energy converter are capable of a direct 60 Hz AC power output from modulating said suspended cathodes to match an AC frequency of a power grid.

\* \* \* \* \*